United States Patent
Lee et al.

(10) Patent No.: US 8,735,248 B2
(45) Date of Patent: May 27, 2014

(54) METHOD OF MANUFACTURING SEMICONDUCTOR DEVICE

(75) Inventors: Jin-wook Lee, Seoul (KR);
Myeong-cheol Kim, Suwon-si (KR);
Heung-sik Park, Yongin-si (KR);
Sang-min Lee, Hwaseong-si (KR);
Hyun-ho Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/475,329

(22) Filed: May 18, 2012

(65) Prior Publication Data

US 2012/0302034 A1    Nov. 29, 2012

(30) Foreign Application Priority Data

May 26, 2011    (KR) ................. 10-2011-0050191

(51) Int. Cl.
*H01L 21/336*    (2006.01)
*H01L 21/4763*    (2006.01)
*H01L 29/78*    (2006.01)

(52) U.S. Cl.
USPC .......... 438/268; 438/283; 438/284; 438/585; 257/329; 257/401

(58) Field of Classification Search
USPC .............. 438/400, 585; 257/E21.54, E21.409
See application file for complete search history.

(56) References Cited

U.S. PATENT DOCUMENTS

| | | | |
|---|---|---|---|
| 2005/0156171 A1* | 7/2005 | Brask et al. | ..... 257/72 |
| 2008/0251839 A1* | 10/2008 | Lee | ..... 257/331 |
| 2009/0253266 A1 | 10/2009 | Yu et al. | |
| 2011/0147812 A1* | 6/2011 | Steigerwald et al. | ..... 257/288 |
| 2011/0237062 A1* | 9/2011 | Na et al. | ..... 438/592 |

FOREIGN PATENT DOCUMENTS

KR    10-2008-0085338    9/2008
KR    10-0944356    2/2010

\* cited by examiner

*Primary Examiner* — Olik Chaudhuri
*Assistant Examiner* — Christine Enad
(74) *Attorney, Agent, or Firm* — Onello & Mello, LLP

(57) ABSTRACT

A method of manufacturing a semiconductor device is provided. The method includes providing a substrate having a protruding channel region, forming a gate insulation layer surrounding the protruding channel region, forming a sacrificial layer having an etch selectivity varying in a thickness direction of the sacrificial layer, on the gate insulation layer, and performing a gate-last process to form a gate electrode on the gate insulation layer in place of the sacrificial layer.

18 Claims, 10 Drawing Sheets

METHOD OF MANUFACTURING SEMICONDUCTOR DEVICE

CROSS-REFERENCE TO RELATED APPLICATIONS

This application claims the benefit of Korean Patent Application No. 10-2011-0050191, filed on May 26, 2011, in the Korean Intellectual Property Office, the disclosure of which is incorporated herein in its entirety by reference.

FIELD

The inventive concept relates to a method of manufacturing a semiconductor device, and more particularly, to a method of manufacturing a semiconductor device having a FinFET structure.

BACKGROUND

As semiconductor devices become more highly integrated and have increasingly high performance, a FinFET transistor having a three dimensional structure has been suggested. A FinFET is a non-planar, double-gate transistor built on a SOI substrate. A distinguishing characteristics of the FinFET is that the conducting channel is wrapped by a thin silicon "fin," which forms the gate of the device. The thickness of the fin determines the effective channel length of the device.

A FinFET transistor can be formed having a gate electrode with a high aspect ratio. Also, to embody a high performance transistor, a metal gate electrode is used instead of polysilicon, which can be formed by a Damascene method. To this end, a sacrificial layer having the same shape as the metal gate electrode is formed. Accordingly, the sacrificial layer is also to have a high aspect ratio. However, since the thickness of a gate insulation layer decreases for high integration, the sacrificial layer is etched at a fast etch speed, that is, a high etch selectivity with respect to an insulation layer. However, since a fast etch speed makes the sacrificial layer have a taper shape in which a lower side is wider than an upper side, undesired voids are generated in a subsequent process of forming a metal gate electrode. Furthermore, reliability of a device may be deteriorated.

SUMMARY

In accordance with aspects of the present inventive concept, provided is a method of manufacturing a semiconductor device in which a sacrificial layer is embodied in a combined layer of an upper layer and a lower layer having different etch selectivities. For instance, the upper layer can include a material having a relatively low etch selectivity and the lower layer can include a material having a relatively high etch selectivity. Thus, the sacrificial layer is prevented from having a taper shape.

According to an aspect of the inventive concept, there is provided a method of manufacturing a semiconductor device, the method including: providing a substrate having a protruding channel region; forming a gate insulation layer surrounding the protruding channel region; forming a sacrificial layer having an etch selectivity varying in a thickness direction of the sacrificial layer, on the gate insulation layer; and performing a gate-last process to form a gate electrode on the gate insulation layer in place of the sacrificial layer.

In some embodiments of the inventive concept, the sacrificial layer may have an etch selectivity increasing closer to the gate insulation layer.

In some embodiments of the inventive concept, the sacrificial layer may have an etch selectivity varying according to a type of impurities included in the sacrificial layer.

In some embodiments of the inventive concept, the sacrificial layer may include a Group III element or a Group V element according to the etch selectivity.

In some embodiments of the inventive concept, the sacrificial layer may include carbon according to the etch selectivity.

In some embodiments of the inventive concept, the sacrificial layer may have an etch selectivity varying according to a concentration of impurities included in the sacrificial layer.

In some embodiments of the inventive concept, the sacrificial layer may have an etch selectivity that continuously or discontinuously varies in a thickness direction of the sacrificial layer.

According to another aspect of the inventive concept, there is provided a method of manufacturing a semiconductor device, the method including: providing a substrate having a protruding channel region; forming a gate insulation layer surrounding the protruding channel region; forming a first sacrificial layer having a first etch selectivity on the gate insulation layer; forming a second sacrificial layer having a second etch selectivity on the first sacrificial layer, the second etch selectivity being lower than the first etch selectivity; and performing a gate-last process to form a gate electrode on the gate insulation layer in place of the first and second sacrificial layers.

In some embodiments of the inventive concept, the method may further include planarizing the first sacrificial layer, after forming the first sacrificial layer.

In some embodiments of the inventive concept, the first sacrificial layer may include a Group V element and the second sacrificial layer may include a Group III element.

In some embodiments of the inventive concept, the first sacrificial layer may include a Group V element and the second sacrificial layer may be undoped.

In some embodiments of the inventive concept, the first sacrificial layer may be undoped and the second sacrificial layer may include a Group V element.

In some embodiments of the inventive concept, the first sacrificial layer may include a Group III element with a low concentration and the second sacrificial layer may include a Group III element with a high concentration.

In some embodiments of the inventive concept, the first sacrificial layer may include a Group V element with a high concentration and the second sacrificial layer may include a Group V element with a low concentration.

In some embodiments of the inventive concept, the first sacrificial layer, the second sacrificial layer, or both may include impurities with a continuously varying concentration.

According to another aspect of the invention, provided is a method of manufacturing a semiconductor device. The method comprises: providing a substrate having a trench formed therein and a protruding portion; forming a device insulation film in the trench; forming a gate insulation layer on the device isolation film and protruding portion; forming a sacrificial layer having an etch selectivity varying in a thickness direction of the sacrificial layer, on the gate insulation layer; and performing a gate-last process to form a plurality of gate electrodes on the gate insulation layer in place of the sacrificial layer, including forming gate electrodes in the trench and on the protruding portion of the substrate.

In some embodiments of the inventive concept, the sacrificial layer may have an etch selectivity increasing closer to the gate insulation layer.

In some embodiments of the inventive concept, the sacrificial layer may have an etch selectivity varying according to a type of impurities included in the sacrificial layer.

In some embodiments of the inventive concept, forming the sacrificial layer may include forming a first sacrificial layer and a second sacrificial layer.

In some embodiments of the inventive concept, the first sacrificial layer, the second sacrificial layer, or both may comprise impurities with a continuously varying concentration.

BRIEF DESCRIPTION OF THE DRAWINGS

Aspects of the inventive concept will be more clearly understood from the following detailed description taken in conjunction with the accompanying drawings in which:

FIGS. 3 and 4 are cross-sectional views of an exemplary embodiment of a semiconductor device according to aspects of the inventive concept, in which FIG. 3 is a cross-sectional view taken along line of FIG. 1 and FIG. 4 is a cross-sectional view taken along line IV-IV' of FIG. 1;

DETAILED DESCRIPTION OF THE EMBODIMENTS

Figure 1:
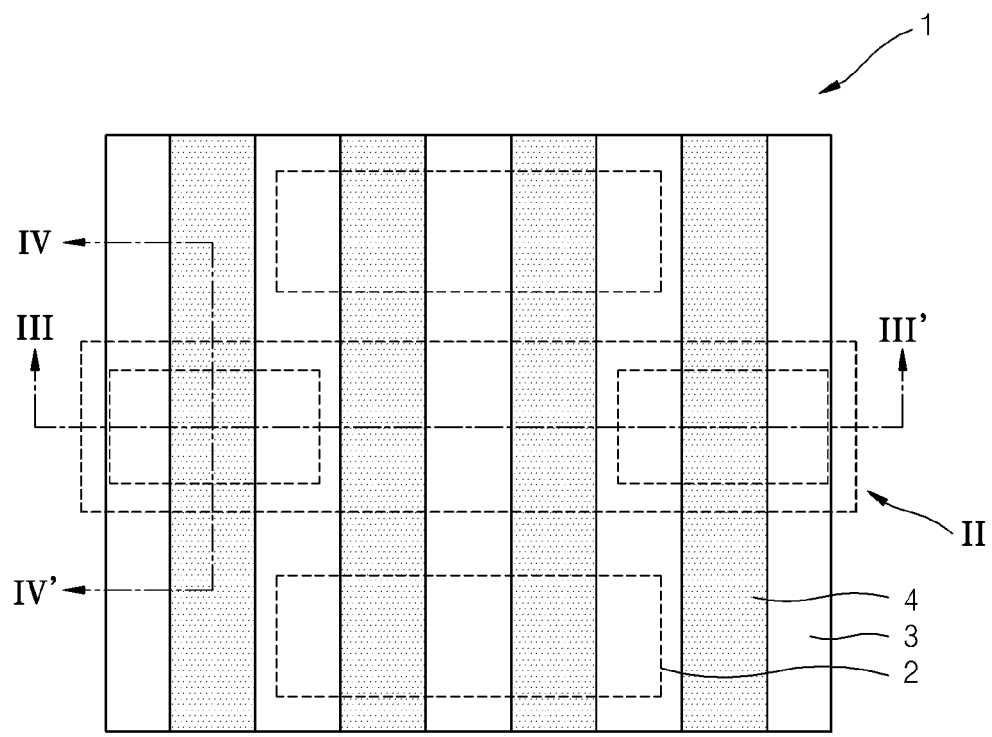
FIG. 1 is a plan view illustrating an exemplary embodiment of a semiconductor device according to aspects of the inventive concept.

Reference will now be made in detail to exemplary embodiments in accordance with aspects of the inventive concept, examples of which are illustrated in the accompanying drawings. However, the inventive concept is not limited to the embodiments illustrated hereinafter. In the drawings, the thicknesses of layers and regions are exaggerated for clarity, and are not to be considered limiting of the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments may be described herein with reference to cross-sectional illustrations that are schematic illustrations of relevant strucutres (and intermediate structures). As such, variations from the shapes of the illustrations as a result, for example, of manufacturing techniques and/or tolerances, are to be expected. Thus, exemplary embodiments, nor the inventive concept, should not be construed as limited to the particular shapes of regions illustrated herein, but may be considered to include or all for deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments or the inventive concept.

Hereinafter, the exemplary embodiments in accordance with the inventive concept are described in detail with reference to the accompanying drawings. The embodiments according to the inventive concept can be applied to various processes for manufacturing various types of semiconductor devices, such as a DRAM (dynamic random access memory), a non-volatile memory, a PRAM (phase-change RAM), a FRAM (ferroelectric RAM), a MRAM (magnetic RAM), a SRAM (static RAM), an embedded memory logic device in which logic devices and memory devices are integrated, a CMOS image sensor, etc. In addition, the embodiments according to the inventive concept can be applied to various regions in the above described devices, such as a cell array region, a core region, a peripheral region, a logic region, a input/output region, etc.

FIG. 1 is a plan view illustrating an exemplary embodiment of a semiconductor device 1 according to aspects of the inventive concept.

Referring to the embodiment of FIG. 1, the semiconductor device 1 may include an inactive region 3 and a gate region 4 extending in one (or a first) direction on the inactive region 2. The semiconductor device 1 also includes an active region 2, which is an area where a gate structure is formed and may be disposed across the gate region 4. In the present embodiment, the shape of the active region 2 is exemplary and the technical concept of the inventive concept is not limited thereto.

Figure 2:
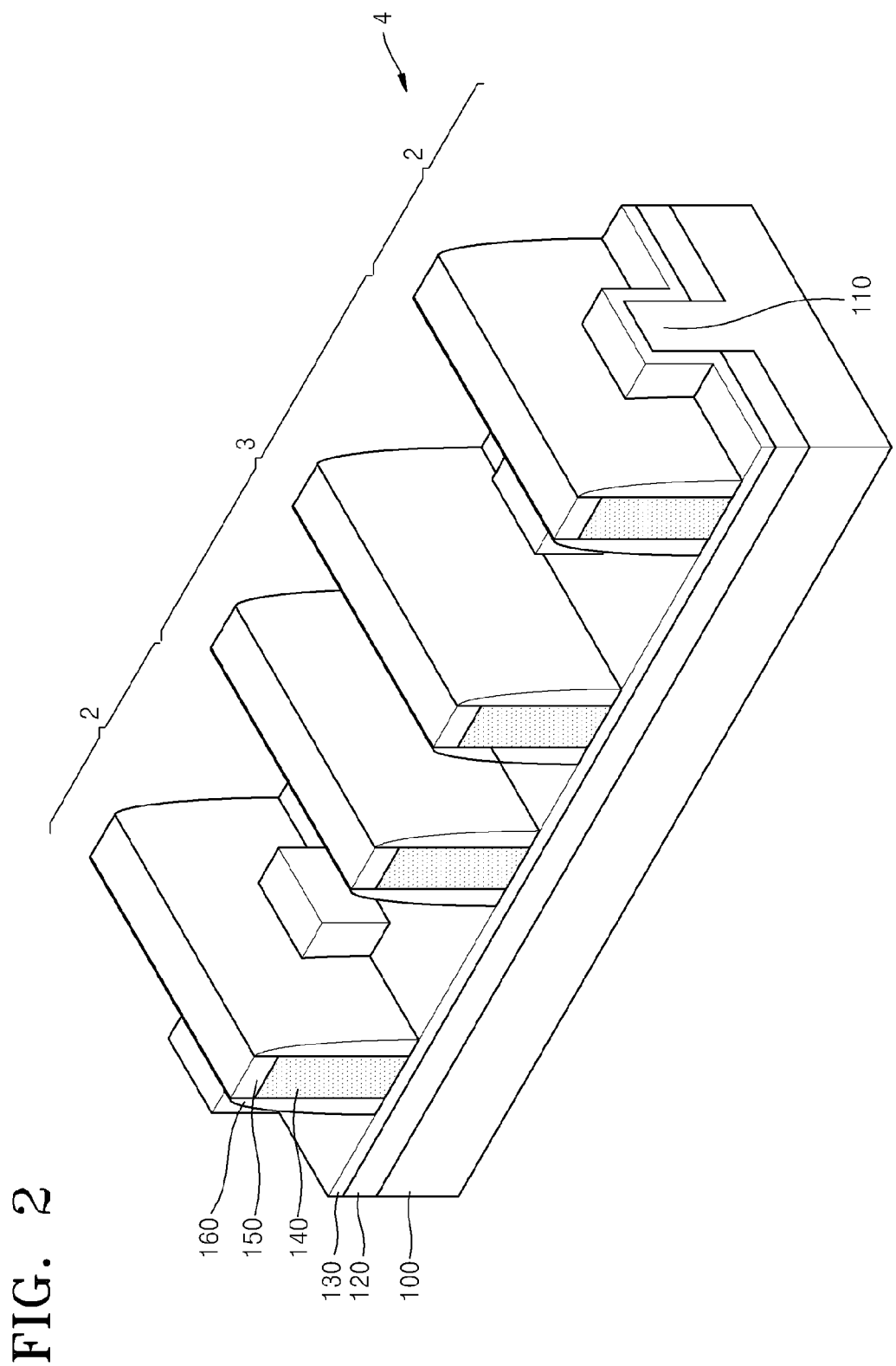
FIG. 2 is a perspective view of an exemplary embodiment of a region II of the semiconductor device of FIG. 1, according to aspects of the inventive concept.
Figure 3:
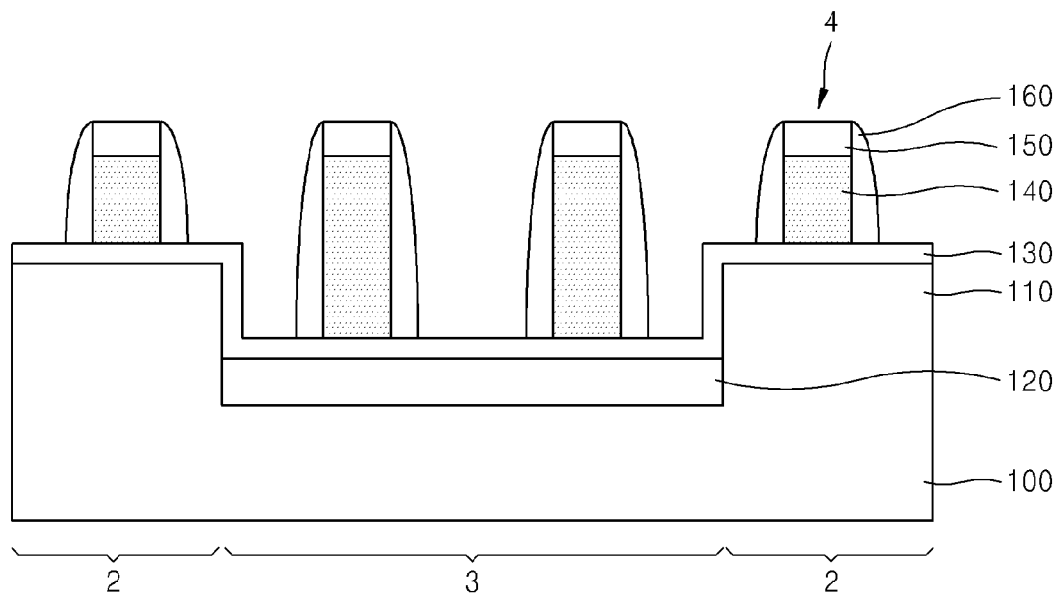
Figure 4:
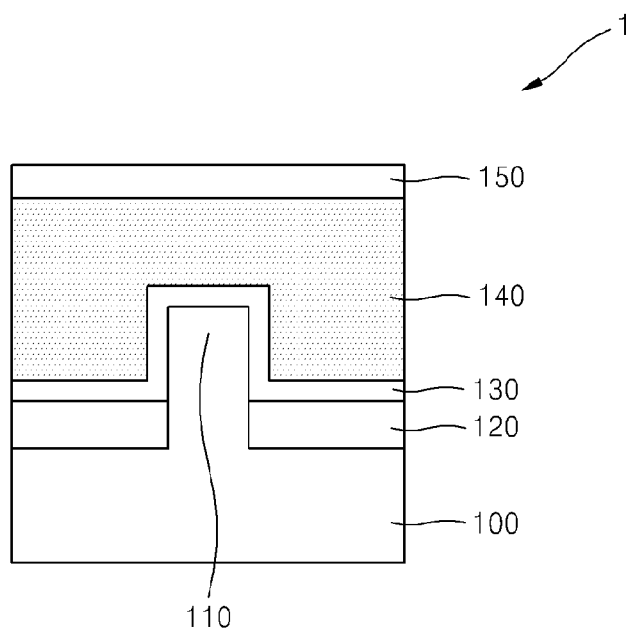

FIG. 2 is a perspective view of an exemplary embodiment of a region II of the semiconductor device 1 of FIG. 1, according to aspects of the inventive concept. FIGS. 3 and 4 are cross-sectional views of the semiconductor device 1 according to exemplary embodiments of the inventive concept. FIG. 3 is a cross-sectional view of semiconductor device 1 taken along line of FIG. 1. FIG. 4 is a cross-sectional view of semiconductor device 1 taken along line IV-IV' of FIG. 1.

Referring to the embodiments of FIGS. 2-4, the semiconductor device 1 may include the active region 2, the inactive region 3, and the gate region 4. The semiconductor device 1 includes a substrate 100 having a protruding portion 110. Also, the substrate 100 may be partially covered with a device isolation film 120. The protruding portion 110 may protrude upwardly from an uppermost portion of the substrate 100, extending to be exposed by penetrating the device isolation film 120, and have a fin shape. A sidewall of the protruding portion 110 may be partially covered with the device isolation film 120.

A gate insulation layer 130 may be disposed on an uppermost portion and the sidewall of the protruding portion 110 to surround the protruding portion 110. The gate insulation layer 130 may extend to be disposed on the device isolation film 120. A gate electrode 140 may be disposed on the gate insulation layer 130. A capping layer 150 may be disposed on an uppermost portion of the gate electrode 140. A spacer 160 may be disposed at both side portions of the gate electrode 140. The gate electrode 140 may extend in one direction. The gate electrode 140 in the active region 2 may be disposed on the gate insulation layer 130 that is disposed on the protruding portion 110. The gate electrode 140 in the inactive region 3 is disposed on the gate insulation layer 130 that is disposed on the device isolation film 120.

The protruding portion 110, the gate insulation layer 130, and the gate electrode 140 may constitute a gate structure. That is, the gate structure may be formed within the active region 2. The protruding portion 110 may form a channel region across an uppermost portion and side portions thereof. Accordingly, the semiconductor device 1 may provide a relatively lengthy channel region compared to the width of the gate structure and consequently reduce the size of such a semiconductor device.

FIGS. 5-15 are cross-sectional views illustrating an exemplary embodiment of a method of manufacturing the semiconductor device 1 of FIG. 3, according to aspects of the inventive concept.

Figure 5:
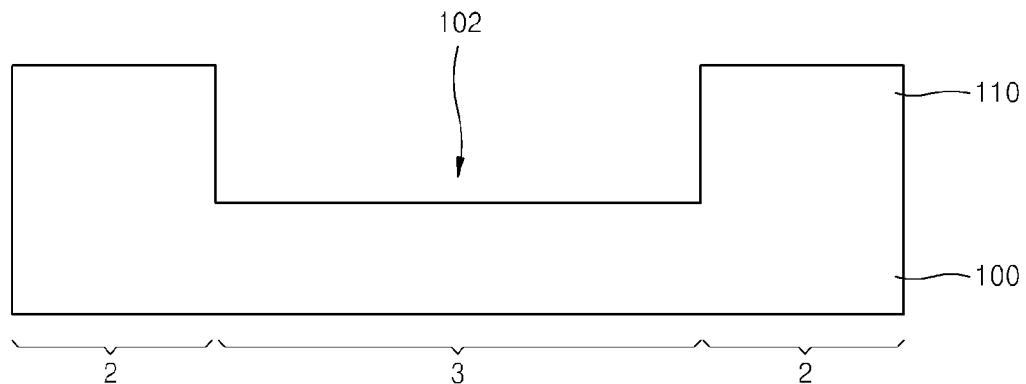
FIGS. 5-15 are cross-sectional views illustrating an exemplary embodiment of a method of manufacturing the semiconductor device of FIG. 3, according to aspects of the inventive concept.

Referring to the embodiment of FIG. 5, the substrate 100 having a trench 102 formed therein and the protruding portion 110 are prepared. The substrate 100 may include a semiconductor material such as silicon (Si) or silicon-germanium (Si—Ge), and may also include an epitaxial layer, a silicon-on-insulator (SOI) layer, and/or a semiconductor-on-insulator (SEOI) layer, as examples. Also, although it is not illustrated, the substrate 100 may further include an additional word line (not shown), an additional bit line (not shown), or other semiconductor devices. The trench 102 may be formed using a lithography process and an etching process, as examples. The protruding portion 110 may be formed in a partial area of the substrate 100 when forming the trench 102. Also, if necessary, impurities may be implanted into the protruding portion 110 and the protruding portion 110 may function as a channel region.

Figure 6:
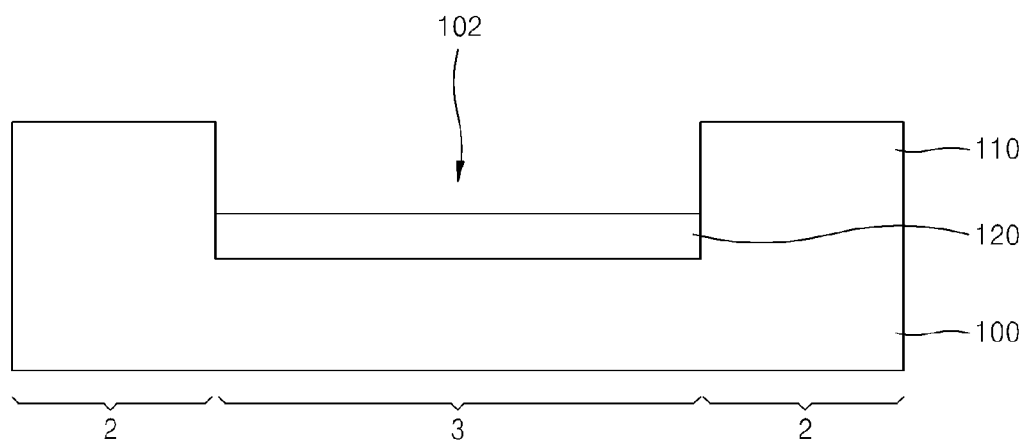

Referring to the embodiment of FIG. 6, the device isolation film 120 is formed in the trench 102 on the substrate 100. It is noted that the device isolation film 120 does not completely fill in the trench 102 during formation thereof. That is, the device isolation film 120 partially fills in the trench 102 and thus the protruding portion 110 may protrude from the device isolation film 120. In various embodiments, the device isolation film 120 may include an insulation material, for example, oxide, nitride, or oxynitride, or may include at least one of, for example, silicon oxide, silicon nitride, and silicon oxynitride. The device isolation film 120 may be formed by performing sputtering, chemical vapor deposition (CVD), plasma enhanced CVD, or atomic layer deposition (ALD), or a photolithography method, an etching method, or a planarization process using chemical-mechanical polishing (CMP) or dry etching. Also, any case in which the above methods are applied to any other layers that are described below is included within the scope of the inventive concept. The device isolation film 120 may be formed by, for example, completely filling the trench 102 with an insulation material and then removing the insulation material using an etch-back method. In this case, dry etching or wet etching may be employed, as examples.

Figure 7:
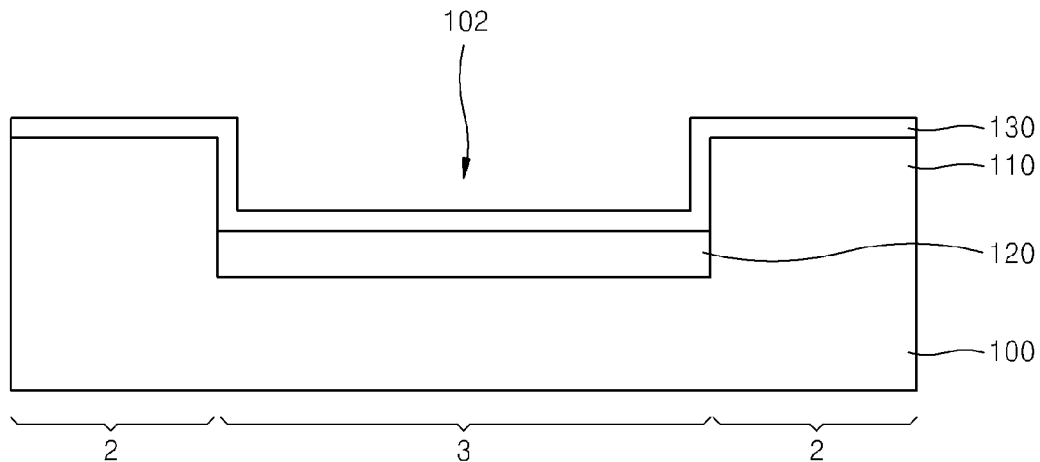

Referring to the embodiment of FIG. 7, the gate insulation layer 130 is formed on the protruding portion 110. The gate insulation layer 130 may be formed surrounding the protruding portion 110, for example, on an uppermost portion and a side portion of the protruding portion 110. Also, the gate insulation layer 130 may be formed on the device isolation film 120. The gate insulation layer 130 may include an insulation material, for example, oxide, nitride, or oxynitride, or may include at least one of, for example, silicon oxide, silicon nitride, and silicon oxynitride. Also, the gate insulation layer 130 may include a high-k dielectric, for example, aluminum oxide ($Al_2O_3$), tantalum oxide ($Ta_2O_3$), titanium oxide ($TiO_2$), yttrium oxide ($Y2O_3$), zirconium oxide ($ZrO_2$), zirconium silicon oxide ($ZrSi_xO_y$), and hafnium oxide ($HfO_2$), hafnium silicon oxide ($HfSi_xO_y$), hafnium aluminum oxide (HfAlO), etc. The gate insulation layer 130 may be formed by lining the lowermost portion and the sidewalls of the trench 102 and the uppermost portion and the side portion of the protruding portion 110 to prevent the trench 102 from being filled completely. The gate insulation layer 130 may be formed by completely filling the trench 102 with an insulation material and then removing part of the insulation material.

Figure 8:
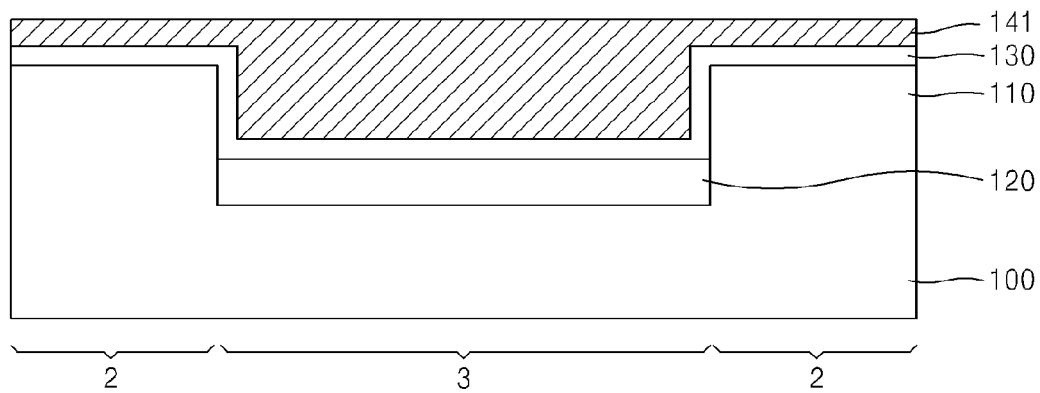

Referring to the embodiment of FIG. 8, a first sacrificial layer 141 is formed on the gate insulation layer 130. The first sacrificial layer 141 may fill in the trench 102. If necessary, the first sacrificial layer 141 may be planarized by performing a chemical-mechanical planarization process, as an example. Also, the first sacrificial layer 141 may extend over the protruding portion 110. Alternatively, to expose the gate insulation layer 130, the first sacrificial layer 141 may not be formed on the gate insulation layer 130.

Figure 9:
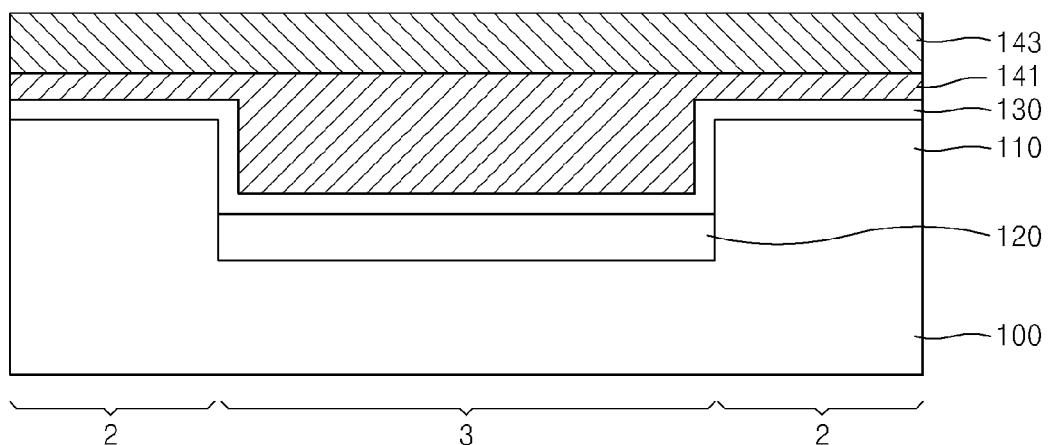

Referring to the embodiment of FIG. 9, a second sacrificial layer 143 is formed on the first sacrificial layer 141. The second sacrificial layer 143 may be formed on the first sacrificial layer 141 that is formed in the trench 102 and/or on the first sacrificial layer 141 that is formed on the gate insulation layer 130. In contrast, when the first sacrificial layer 141 is not formed on the gate insulation layer 130, the second sacrificial layer 143 may be formed directly on the gate insulation layer 130. If necessary, the second sacrificial layer 143 may be planarized by performing a chemical-mechanical planarization process.

The first sacrificial layer 141 and the second sacrificial layer 143 may include the same material, for example, silicon. The first sacrificial layer 141 and the second sacrificial layer 143 may have etch selectivities different from each other. The first sacrificial layer 141 and the second sacrificial layer 143 may have etch selectivities varying in a thickness direction thereof. The first sacrificial layer 141 and the second sacrificial layer 143 may have etch selectivities increasing closer to the gate insulation layer 130. The first sacrificial layer 141 and the second sacrificial layer 143 may have etch selectivities varying according to the type and/or the concentration of impurities included therein. The first sacrificial layer 141 and the second sacrificial layer 143 may include elements of Group III or V according to an etch selectivity. The first sacrificial layer 141 and the second sacrificial layer 143 may include carbon according to the etch selectivity. The first sacrificial layer 141 and the second sacrificial layer 143 may have etch selectivities discontinuously varying in the thickness direction thereof. The first sacrificial layer 141 and the second sacrificial layer 143 may have etch selectivities continuously, discontinuously, and/or gradually varying in the thickness direction thereof.

In the present specification, the etch selectivity is an etch selectivity with respect to an insulation layer, such as the gate insulation layer 130. While the first sacrificial layer 141 may have a first etch selectivity, the second sacrificial layer 143 may have a second etch selectivity that is lower than the first etch selectivity. The first sacrificial layer 141 may have the first etch selectivity between, for example, 5:1 to 100:1; for example, the first etch selectivity can be about 10:1. In contrast, the second sacrificial layer 143 may have the second etch selectivity between, for example, 1:1 to 5:1; for example, the second etch selectivity can be about 3:1. The expression "x:1" signifies that, while a thickness corresponding to "1" of an insulation layer is etched, a thickness corresponding to "x" of the first sacrificial layer 141 or the second sacrificial layer 143 is etched. Thus, a material having a low etch selectivity may have high etch-resistance, whereas a material having a high etch selectivity may have low etch-resistance. Also, in some cases, a material having a low etch selectivity may have a low etch rate, whereas a material having a high etch selectivity may have high etch rate.

It has been determined, in accordance with the present invention, that an etch selectivity increases when silicon includes an element of Group V as impurities and an etch selectivity decreases when silicon includes an element of Group III as impurities. Thus, the etch selectivities of the first sacrificial layer 141 and the second sacrificial layer 143 may vary by changing the type and the concentration of the impurities of first sacrificial layer 141 and the second sacrificial layer 143. Table 1 below shows exemplary embodiments for varying the etch selectivities of the first sacrificial layer 141 and the second sacrificial layer 143. Each embodiment of Table 1 shows the type and the concentration of impurities that can be included in the first sacrificial layer 141 and the second sacrificial layer 143.

TABLE 1

| | First sacrificial layer 141 | Second sacrificial layer 143 |
| --- | --- | --- |
| Embodiment 1 | Group V element | Group III element |
| Embodiment 2 | Group V element | undoped |
| Embodiment 3 | undoped | Group III element |
| Embodiment 4 | Group III element with low concentration | Group III element with high concentration |
| Embodiment 5 | Group V element with high concentration | Group V element with low concentration |

As shown in Embodiment 1 of Table 1, the first sacrificial layer 141 requiring a high etch selectivity may include a Group V element, such as nitrogen (N), phosphor (P), arsenic (As), antimony (Sb), bismuth (Bi), etc. In contrast, the second sacrificial layer 143 requiring a low etch selectivity may include a Group III element, such as boron (B), aluminum (Al), gallium (Ga), indium (In), thallium (Tl), etc.

As shown in Embodiment 2 of Table 1, the first sacrificial layer 141 may include the Group V element, whereas the second sacrificial layer 143 may be provided without impurities, in some embodiment.

As shown in Embodiment 3 of Table 1, the first sacrificial layer 141 may not include impurities, whereas the second sacrificial layer 143 may include the Group III element.

As shown in Embodiment 4 of Table 1, the first sacrificial layer 141 and the second sacrificial layer 143 both may include the Group III element. While the first sacrificial layer 141 may include a Group III element with a low concentration, the second sacrificial layer 143 may include a Group III element with a high concentration. Also, the concentration of the Group III element may continuously, discontinuously, and/or gradually vary in the second sacrificial layer 143 and/or the first sacrificial layer 141. In particular, in the first sacrificial layer 141, the concentration of the Group III element may decrease closer to a lower portion adjacent to the gate insulation layer 130, compared to an upper portion thereof.

As shown in Embodiment 5 of Table 1, the first sacrificial layer 141 and the second sacrificial layer 143 may both include a Group V element. The first sacrificial layer 141 may include a Group V element with a high concentration, and the second sacrificial layer 143 may include a Group V element with a low concentration. The concentration of the Group V element may continuously, discontinuously, and/or gradually vary in the second sacrificial layer 143 and/or the first sacrificial layer 141. In particular, in the first sacrificial layer 141, the concentration of the Group V element may increase closer to a lower portion adjacent to the gate insulation layer 130, compared to an upper portion thereof.

When the first sacrificial layer 141 has the first etch selectivity and the second sacrificial layer 143 has the second etch selectivity, the etch selectivity may discontinuously vary at a boundary between the first sacrificial layer 141 and the second sacrificial layer 143. In contrast, when the concentration of the impurities in each of the first sacrificial layer 141 and the second sacrificial layer 143 varies, the etch selectivity may vary continuously, discontinuously, and/or gradually.

Also, a case of including carbon as impurities in the first sacrificial layer 141 and/or the second sacrificial layer 143 in place of or with the Group III element is within the scope of the inventive concept. Carbon, similar to the Group III element, performs a function of reducing the etch selectivity.

Also, a case of replacing the Group III element with a Group II element or the Group V element with a Group VI element is within the scope of the inventive concept.

The impurities may be injected into the first sacrificial layer 141 and the second sacrificial layer 143 using an ion implantation method or a thermal diffusivity method, as examples.

In a subsequent process, a gate electrode 140 (refer to FIG. 15) may be formed in place of the first sacrificial layer 141 and the second sacrificial layer 143. That is, the gate electrode 140 may be formed by removing the first sacrificial layer 141 and the second sacrificial layer 143 and filling a conductive material in an empty space formed in a sacrificial insulation layer 148. This process may be referred to as a "gate-last process."

Figure 10:
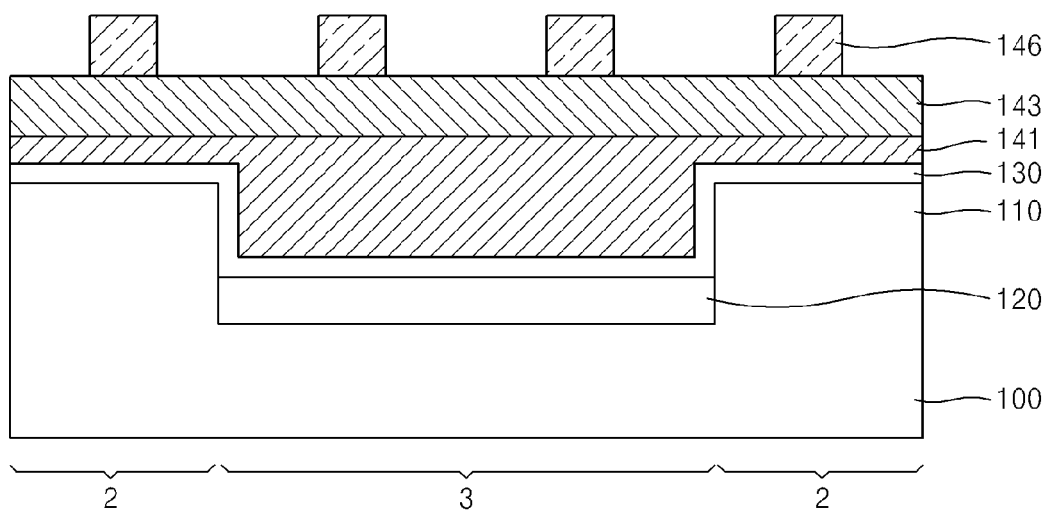

Referring to the exemplary embodiment of FIG. 10, a mask pattern 146 is formed on the second sacrificial layer 143. The mask pattern 146 may be a photoresist pattern or a hard mask pattern.

Figure 11:
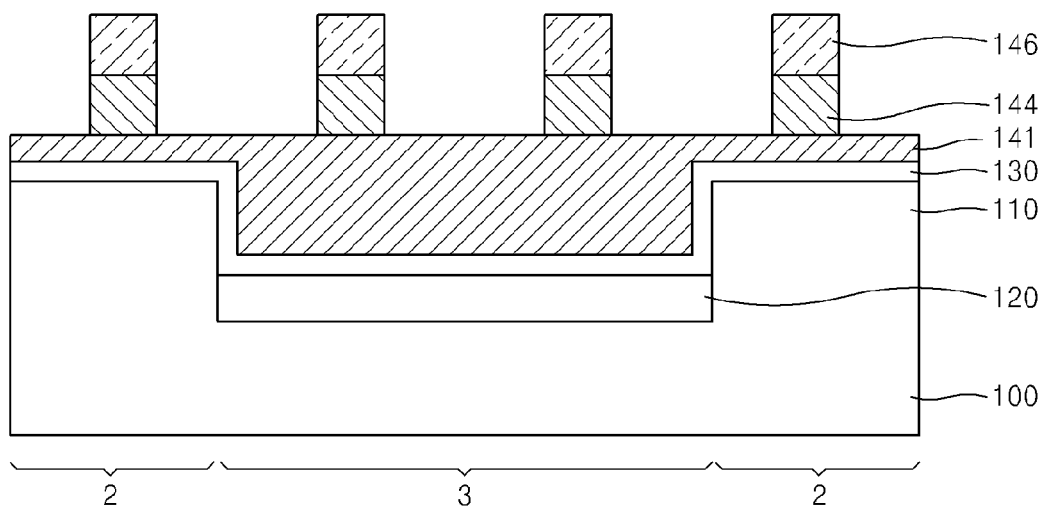

Referring to the exemplary embodiment of FIG. 11, a second sacrificial layer pattern 144 is formed by removing a partial area of the second sacrificial layer 143 using the mask pattern 146 as an etch mask. As described above, the second sacrificial layer 143 may have the second etch selectivity in a range of, for example, 1:1 to 5:1; for example, the second etch selectivity may be about 3:1. In the present operation, a fluorine containing gas may be used as an etchant, as an example. The fluorine containing gas may be $C_xF_y$, $SF_6$, $NF_3$, HF, etc.

Figure 12:
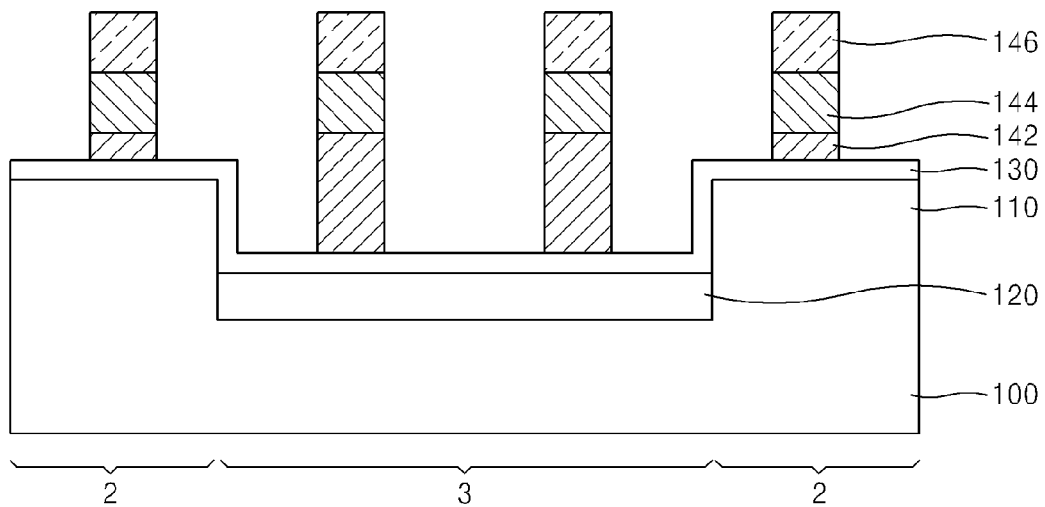

Referring to the exemplary embodiment of FIG. 12, a first sacrificial layer pattern 142 is formed using the mask pattern 146 as an etch mask. As described above, the first sacrificial layer 141 may have the first etch selectivity in a range of, for example, 5:1 to 100:1; for example, preferably an etch selectivity of about 10:1. In the present operation, $Cl_2$, HBr, HCl, HI, $O_2$, etc. may be used as an etchant, as examples. Thus, the first sacrificial layer 141 may have an etch selectivity higher than that of the second sacrificial layer 143, and may have a faster etch rate in some cases.

When a silicon layer acting as a sacrificial layer is etched at a high etch selectivity to form a pattern, the pattern may have a taper shape in which a lower portion is larger than an upper portion. The formation of such a taper shape may be prevented, according to aspects of the inventive concept. That is, since the first sacrificial layer 141 having a high etch selectivity is formed in a lower portion and the second sacrificial layer 143 having a low etch selectivity is formed on the first sacrificial layer 141, a pattern of a taper shape may be consequently prevented from being formed. Accordingly, in a subsequent process, the formation of voids in the gate electrode 140 formed in place of the first sacrificial layer 141 and the second sacrificial layer 143 may be prevented. Also, since the first sacrificial layer 141 having a high etch selectivity is formed adjacent to the gate insulation layer 130, undesirable etch of the gate insulation layer 130 may be prevented during etching of the first sacrificial layer 141.

Figure 13:
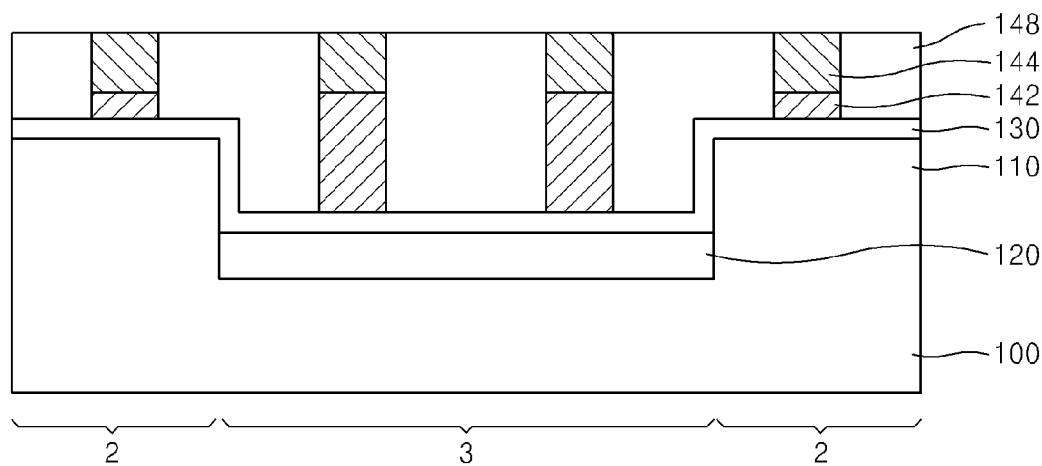

Referring to the exemplary embodiment of FIG. 13, the mask pattern 146 is removed and the sacrificial insulation layer 148 is foamed between the stacked first and second sacrificial layer patterns 142, 144. The sacrificial insulation layer 148 may include an insulation material, for example, oxide, nitride, or oxynitride, or may include at least one of, for example, silicon oxide, silicon nitride, and silicon oxynitride. The sacrificial insulation layer 148 may have an etch selectivity different from that of the gate insulation layer 130. That is, when the sacrificial insulation layer 148 is removed in a subsequent process, it is noted that the gate insulation layer 130 is not removed. For example, when the gate insulation layer 130 includes silicon oxide, the sacrificial insulation layer 148 may include silicon nitride or vice versa.

Figure 14:
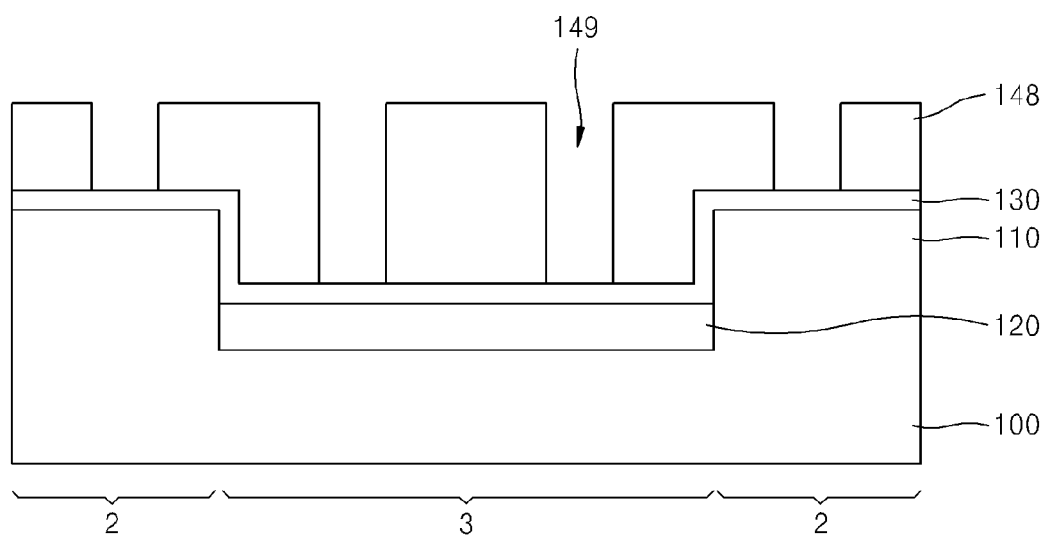

Referring to the exemplary embodiment of FIG. 14, the first sacrificial layer pattern 142 and the second sacrificial layer pattern 144 are removed and accordingly an opening portion 149 is formed in the sacrificial insulation layer 148. The opening portion 149 may expose portions of the gate insulation layer 130. In particular, to form a gate, the opening portion 149 exposes portions of the gate insulation layer 130 disposed on the protruding portion 110. As described above, since the first sacrificial layer pattern 142 is substantially prevented from having a taper shaper, the taper shape may not be formed in the opening portion 149, or at least the formation of a taper shape in the opening portion 149 may be minimized.

Figure 15:
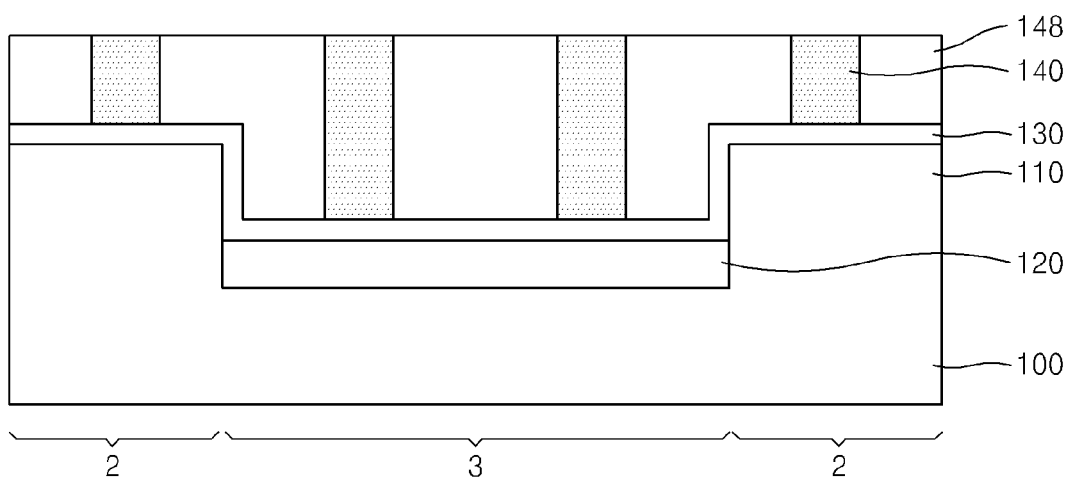

Referring to the exemplary embodiment of FIG. 15, the gate electrode 140 is formed by filling the opening portion 149 with a conductive material. The gate electrode 140 may include, for example, metal such as aluminum (Al), copper (Cu), tungsten (W), titanium (Ti), tantalum (Ta), etc., or an alloy such as titanium tungsten (TiW), titanium aluminum (TiAl), etc., or nitrides of the metal or the alloy. Also, the gate electrode 140 may be configured in a single layer or a composite layer. As described above, since a taper shape may not be formed in the opening portion 149, or may be formed in a minimized form therein, the gate electrode 140 may be filled in such a manner that no void is generated in the opening portion 149. Accordingly, a metal gate electrode having a high aspect ratio may be reliably formed.

The sacrificial insulation layer 148 is removed and the capping layer 150 and the spacer 160 are formed on the gate electrode 140 so that the semiconductor device 1 of FIG. 3 is completed. The capping layer 150 and the spacer 160 may include an insulation material, for example, oxide, nitride, or oxynitride, or may include at least one of, for example, silicon oxide, silicon nitride, and silicon oxynitride. Also, the spacer 160 may be formed by using the sacrificial insulation layer 148. For example, the spacer 160 may be formed by maintaining some of the sacrificial insulation layer 148, to be left on the side portion of the gate electrode 140.

Figure 16:
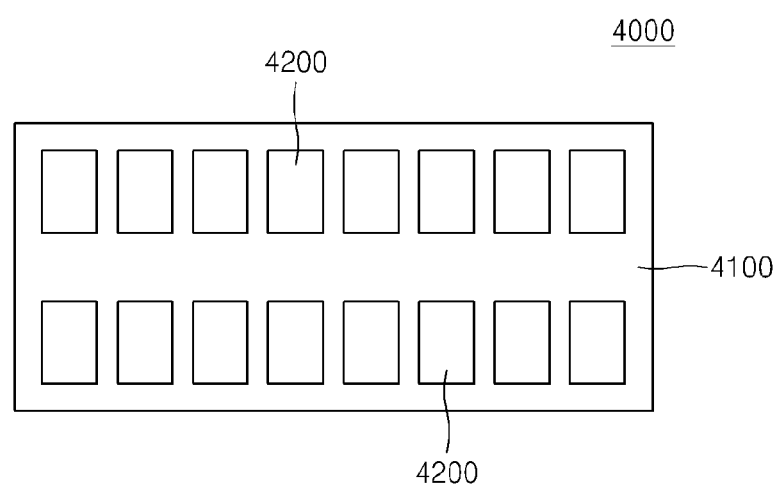
FIG. 16 is a plan view of an exemplary embodiment of a memory module including a semiconductor device, according to aspects of the inventive concept.

FIG. 16 is a plan view of an exemplary embodiment of a memory module 4000 including a semiconductor device, according to exemplary embodiments of the inventive concept. Referring to FIG. 16, the memory module 4000 includes a printed circuit board 4100 and a plurality of semiconductor packages 4200. The semiconductor packages 4200 may include a semiconductor device formed by a method according aspects of the inventive concept, such as that described above. The memory module 4000 may be a single in-line memory module (SIMM) in which the semiconductor packages 4200 are mounted only on one surface of a printed circuit board, or a dual in-line memory module (DIMM) in which the semiconductor packages 4200 are mounted on both surfaces of a printed circuit board. Also, the memory module 4000 according to aspects of the inventive concept may be a fully buffered DIMM (FBDIMM) having an advanced memory buffer (AMB) for providing external signals to each of the semiconductor packages 4200.

Figure 17:
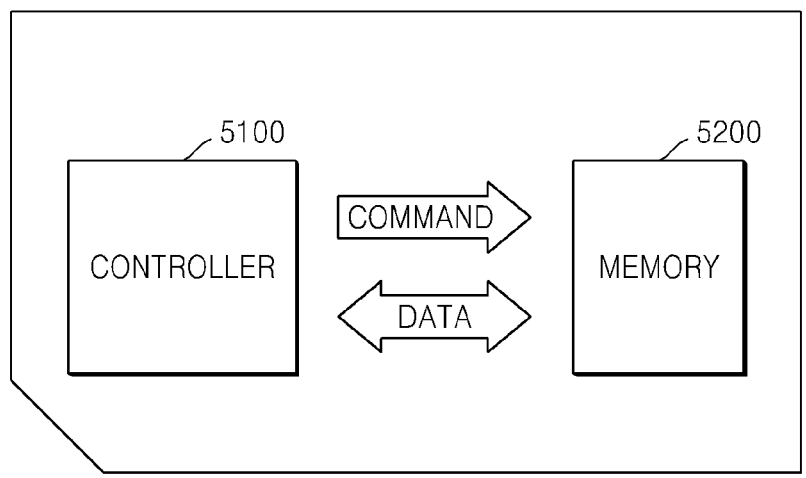
FIG. 17 schematically illustrates an exemplary embodiment of a card according to an aspect of the inventive concept.

FIG. 17 schematically illustrates an exemplary embodiment of a card 5000 according to aspects of the inventive concept.

Referring to the embodiment of FIG. 17, a controller 5100 and a memory 5200 are disposed to send/receive electric signals to/from each other. For example, when the controller 5100 gives a command to the memory 5200, the memory 5200 can send data. The memory 5200 can include the semiconductor device according to aspects of the inventive concept. The semiconductor device according to the various embodiments of the inventive concept can be disposed in an architecture arrays in correspondence with the logic gate design. The memory arrays disposed in a plurality of rows and columns can have one or more memory array bank (not shown). The memory 5200 can include the memory array (not shown) or the memory array bank (not shown). The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 18:
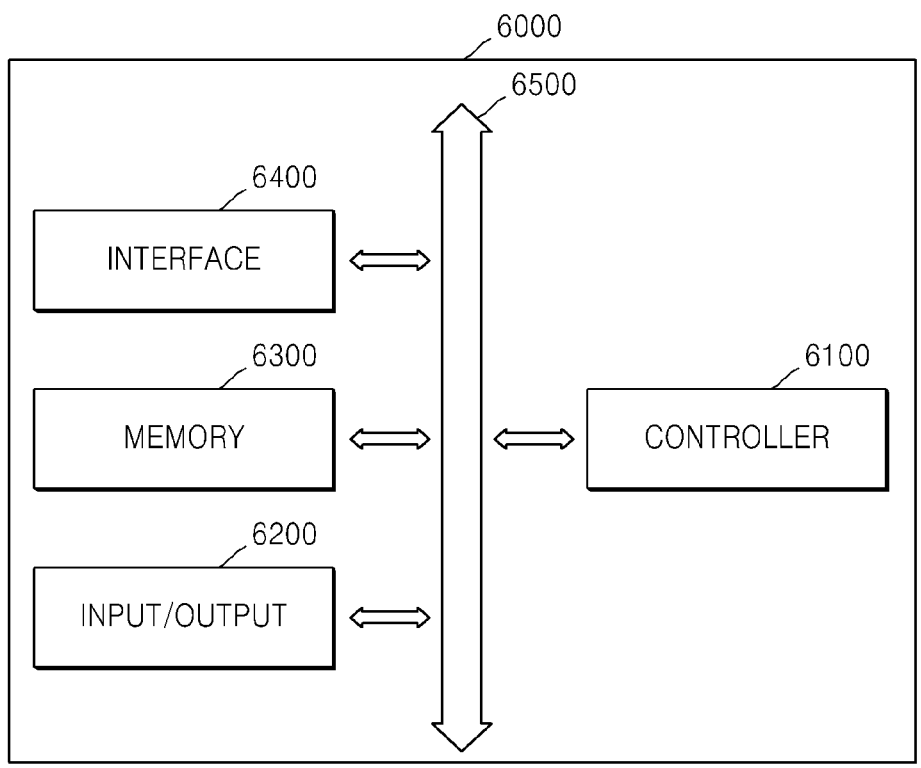
FIG. 18 schematically illustrates an exemplary embodiment of a system according to an aspect of the inventive concept.

FIG. 18 schematically illustrates an exemplary embodiment of a system 6000 according aspects of the inventive concept.

Referring to the embodiment of FIG. 18, the system 6000 may include a controller 6100, an input/output device 6200, a memory 6300, and an interface 6400. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or the like. The input/output device 6300 can be used to input or output data of the system 6000. The system 6000 is connected to an external apparatus, for example, a personal computer or a network, using the input/output device 6200, to send/receive data to/from the external apparatus. The input/output device 6200 may be a keypad, a keyboard, or a display. The memory 6300 may store codes and/or data for operating the controller 6100 and/or may store data processed by the controller 6100. The memory 6300 may include a semiconductor device according to aspects of the inventive concept. The interface 6400 may be a data transmission path between the system 6000 and an external apparatus, for example. The controller 6100, the input/output device 6200, the memory 6300, and the interface 6400 may communicate with one another by a bus 6500. For example, the system 6000 can be used for a mobile phone, a MP3 player, a navigation system, a portable multimedia player (PMP), a solid state disk (SSD), or a household appliance.

While exemplary embodiments in accordance with the inventive concept have been particularly shown and described, it will be understood that various changes in form and details may be made therein without departing from the spirit and scope of the inventive concept.

What is claimed is:

1. A method of manufacturing a semiconductor device, the method comprising:
    providing a substrate having a protruding channel region;
    forming a gate insulation layer surrounding the protruding channel region;
    forming first and second sacrificial layers on the gate insulation layer, each of the first and second sacrificial layers having an etch selectivity varying vertically in a thickness direction of each sacrificial layer; and
    performing a gate-last process to form a gate electrode on the gate insulation layer in place of the first and second sacrificial layers,
    wherein each sacrificial layer has an etch selectivity varying according to a concentration of impurities included in the sacrificial layer.

2. The method of claim 1, wherein at least one of the sacrificial layers has an etch selectivity increasing closer to the gate insulation layer.

3. The method of claim 1, wherein at least one of the sacrificial layers has an etch selectivity varying according to a type of impurities included in the sacrificial layer.

4. The method of claim 1, wherein at least one of the sacrificial layers comprises a Group III element or a Group V element according to the etch selectivity.

5. The method of claim 1, wherein at least one of the sacrificial layers comprises carbon according to the etch selectivity.

6. The method of claim 1, wherein at least one of the sacrificial layers has an etch selectivity that continuously or discontinuously varies in a thickness direction of the sacrificial layer.

7. A method of manufacturing a semiconductor device, the method comprising:
    providing a substrate having a protruding channel region;
    forming a gate insulation layer surrounding the protruding channel region;
    forming a first sacrificial layer having a first etch selectivity on the gate insulation layer;
    forming a second sacrificial layer having a second etch selectivity on the first sacrificial layer, the second etch selectivity being lower than the first etch selectivity; and
    performing a gate-last process to form a gate electrode on the gate insulation layer in place of the first and second sacrificial layers,
    wherein each of the first and second sacrificial layers has an etch selectivity varying according to a concentration of impurities included in the sacrificial layer.

8. The method of claim 7, further comprising planarizing the first sacrificial layer, after forming the first sacrificial layer.

9. The method of claim 7, wherein the first sacrificial layer comprises a Group V element and the second sacrificial layer comprises a Group III element.

10. The method of claim 7, wherein the first sacrificial layer comprises a Group V element and the second sacrificial layer is undoped.

11. The method of claim 7, wherein the first sacrificial layer is undoped and the second sacrificial layer comprises a Group V element.

12. The method of claim 7, wherein the first sacrificial layer comprises a Group III element with a low concentration and the second sacrificial layer comprises a Group III element with a high concentration.

13. The method of claim 7, wherein the first sacrificial layer comprises a Group V element with a high concentration and the second sacrificial layer comprises a Group V element with a low concentration.

14. The method of claim 7, wherein the first sacrificial layer, the second sacrificial layer, or both comprise impurities with a continuously varying concentration.

15. A method of manufacturing a semiconductor device, the method comprising:
    providing a substrate having a trench formed therein and a protruding portion;
    forming a device insulation film in the trench;
    forming a gate insulation layer on the device isolation film and protruding portion;
    forming first and second sacrificial layers on the gate insulation layer, each of the first and second sacrificial layers having an etch selectivity varying vertically in a thickness direction of each sacrificial layer; and performing a gate-last process to form a plurality of gate electrodes on the gate insulation layer in place of the first and second sacrificial layers, including forming gate electrodes in the trench and on the protruding portion of the substrate, wherein each of the first and second sacrificial layers has an etch selectivity varying according to a concentration of impurities included in the sacrificial layer.

16. The method of claim 15, wherein at least one of the sacrificial layers has an etch selectivity increasing closer to the gate insulation layer.

17. The method of claim 15, wherein at least one of the sacrificial layers has an etch selectivity varying according to a type of impurities included in the sacrificial layer.

18. The method of claim 15, wherein the first sacrificial layer, the second sacrificial layer, or both comprise impurities with a continuously varying concentration.

* * * * *